United States Patent [19]

Arques

[11] Patent Number: 4,598,320
[45] Date of Patent: Jul. 1, 1986

[54] SOLID STATE PHOTOSENSITIVE DEVICE

[75] Inventor: Marc Arques, Grenoble, France

[73] Assignee: Thomson-CSF, Paris, France

[21] Appl. No.: 618,506

[22] Filed: Jun. 8, 1984

[30] Foreign Application Priority Data

Jun. 14, 1983 [FR] France ................. 83 09827

[51] Int. Cl.$^4$ ............................................. H04N 3/15
[52] U.S. Cl. ................................................... 358/213
[58] Field of Search ........................... 358/213, 212; 357/24 LR; 250/578

[56] References Cited

U.S. PATENT DOCUMENTS

| | | | |
|---|---|---|---|
| 4,087,833 | 2/1978 | Tseng | 358/213 |
| 4,382,187 | 5/1983 | Fraleux | 358/213 |
| 4,390,791 | 6/1983 | Hatanaka | 358/213 |
| 4,462,047 | 7/1984 | Fujimoto | 358/213 |
| 4,496,980 | 1/1985 | Pfleiderer | 358/213 |

FOREIGN PATENT DOCUMENTS 0028960 5/1981 European Pat. Off. .
0038725 10/1981 European Pat. Off. .

OTHER PUBLICATIONS

IEEE Transactions on Electron Devices, vol. ED-27, No. 1, Jan. 1980, pp. 175-188, New York (USA); P. Felix et al.: "CCD Readout of . . . ".

*Primary Examiner*—Gene Z. Rubinson
*Assistant Examiner*—L. C. Schroeder
*Attorney, Agent, or Firm*—Roland Plottel

[57] ABSTRACT

A solid state photosensitive device according to the invention comprises at least one photonic and charges integration cell connected to a reading stage constituted by voltage reading means each connected to a cell through the intermediary of means allowing to read the potential corresponding to the quantity of charge in the integration zone of the said cell, at least one addressing means in order to address sequentially one of the reading means and means for return to zero of the previously read detection and integration cell.

15 Claims, 5 Drawing Figures

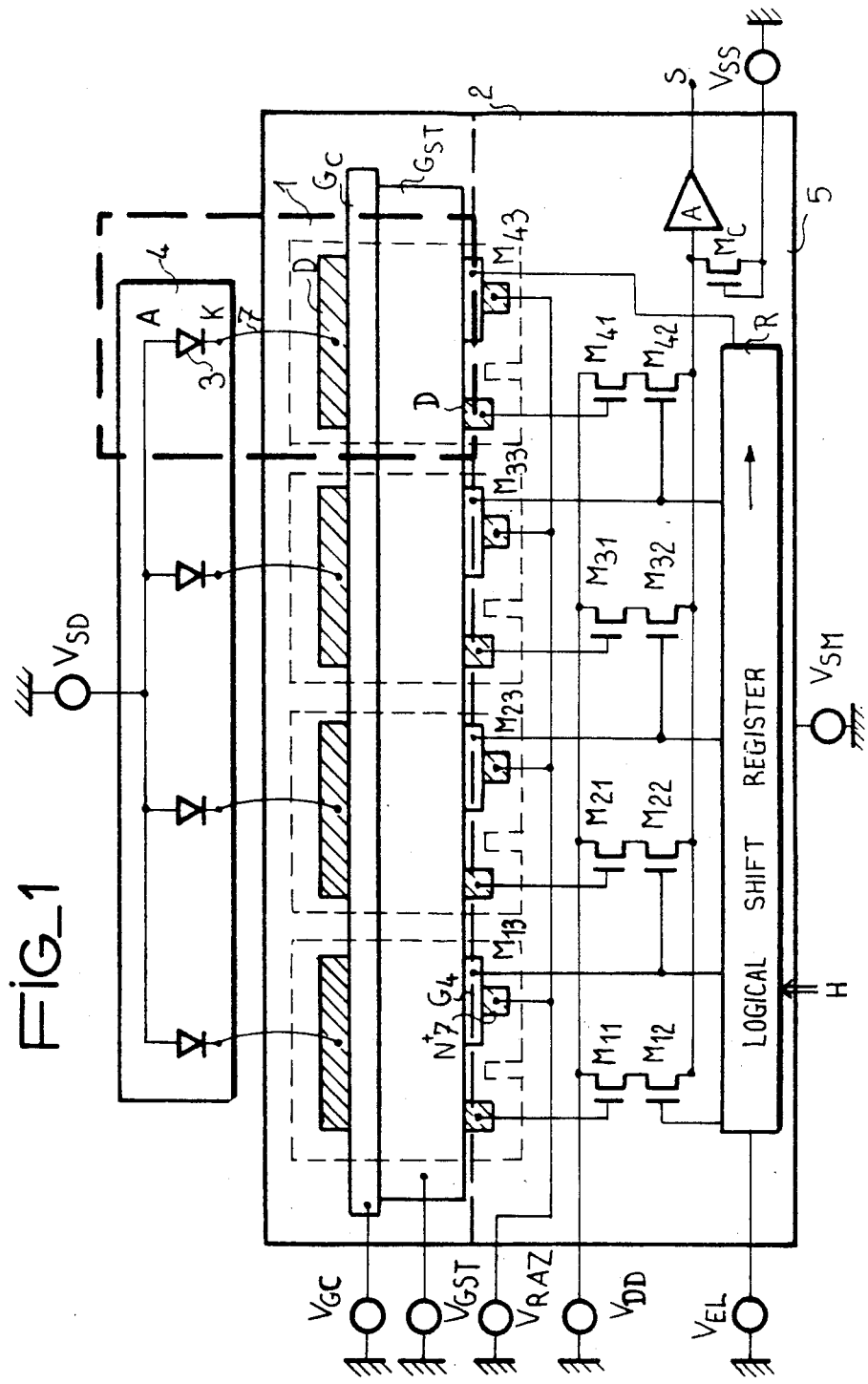
FIG_1

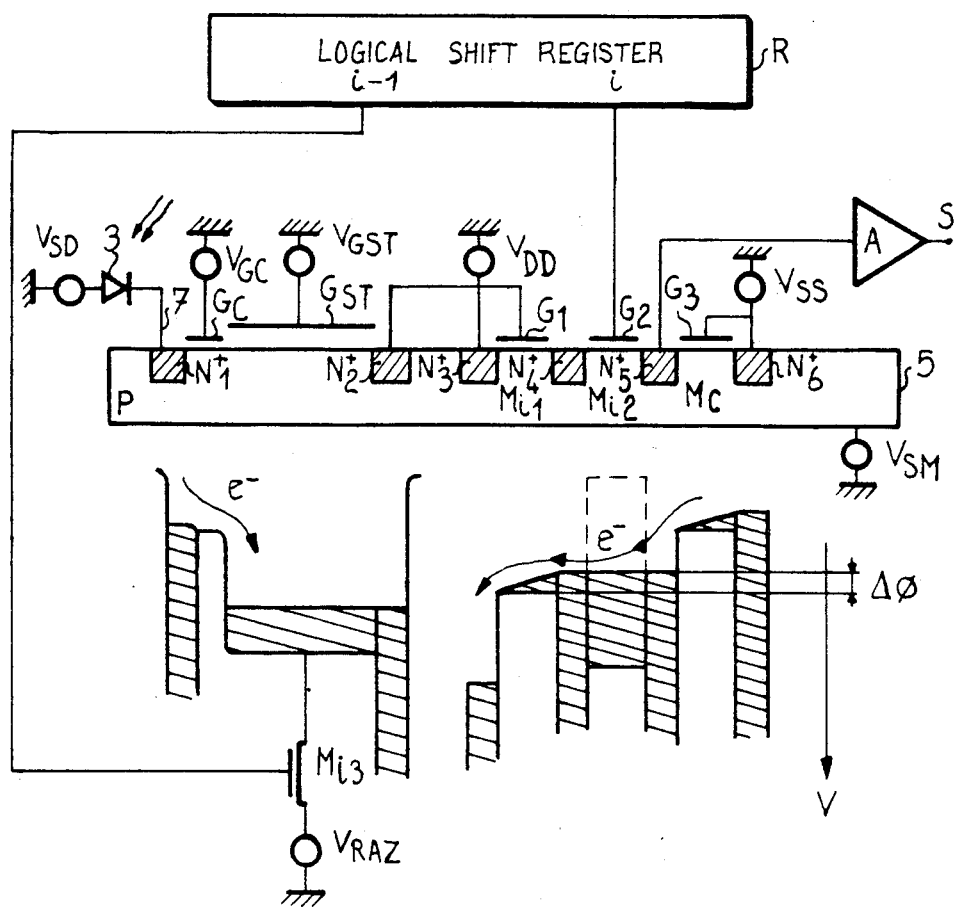
FIG_2

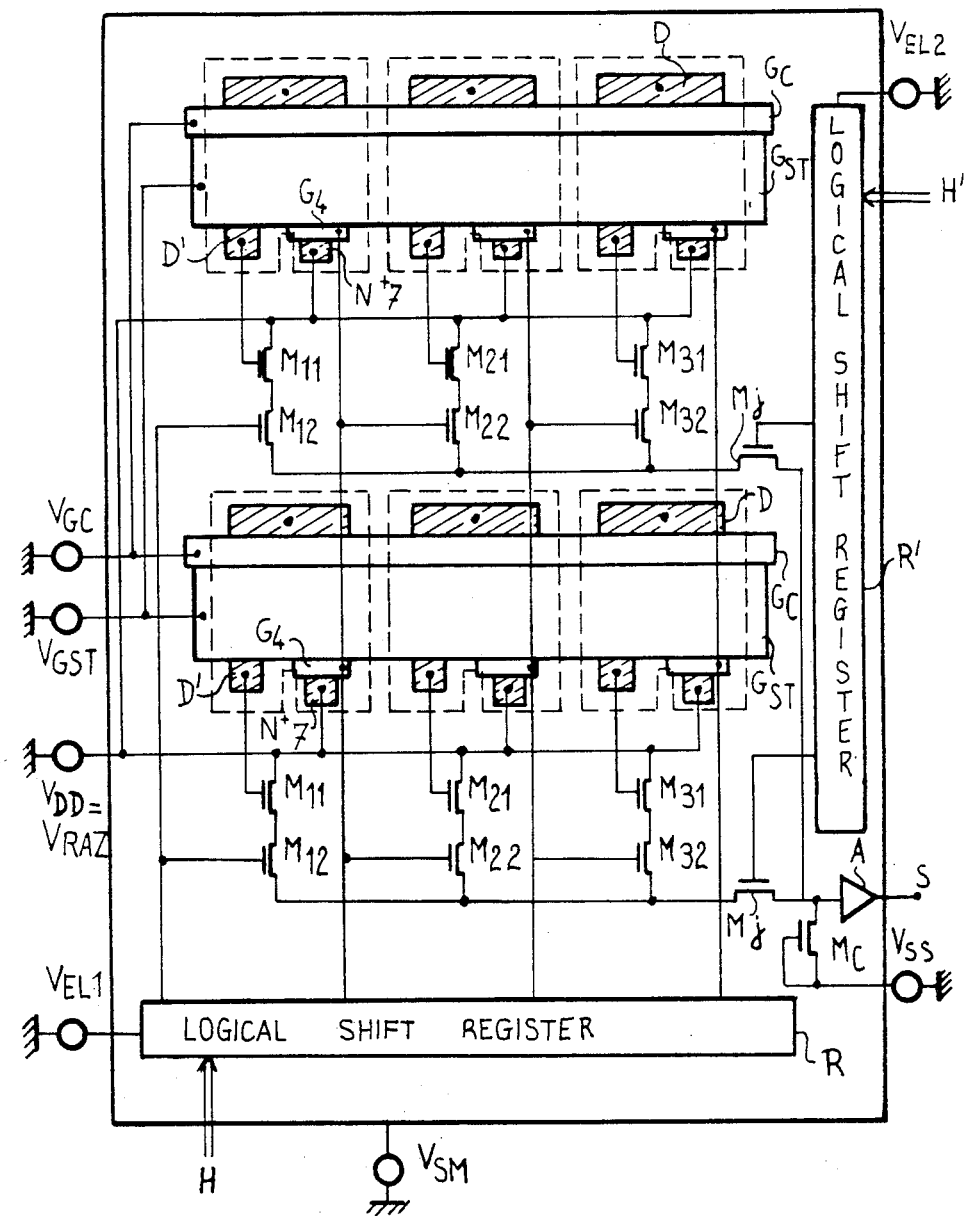
FIG_3

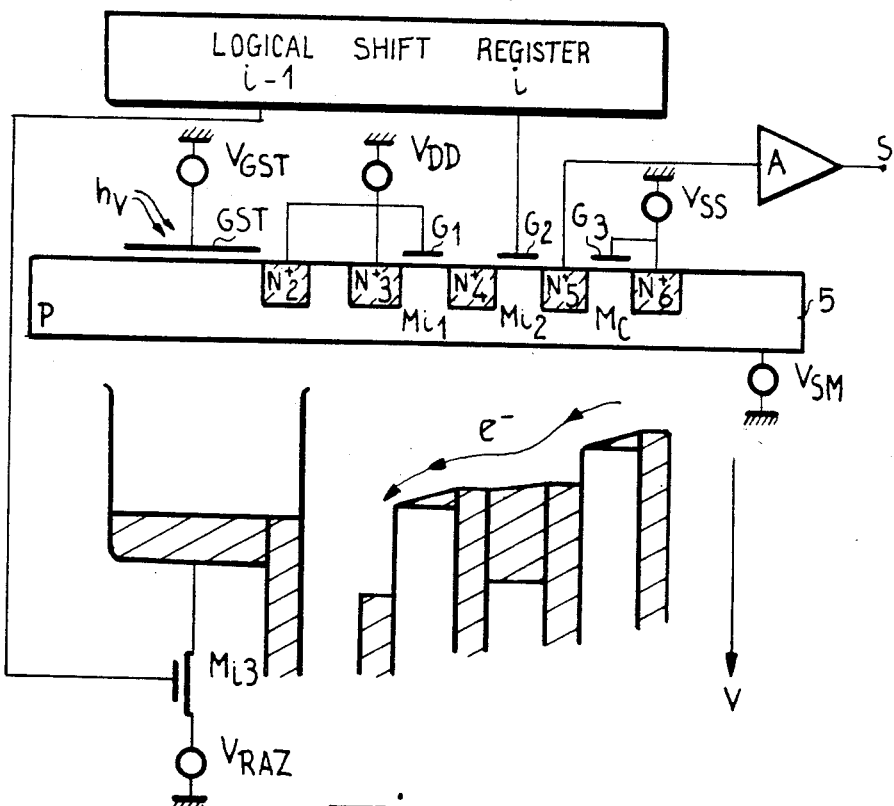
FIG_4
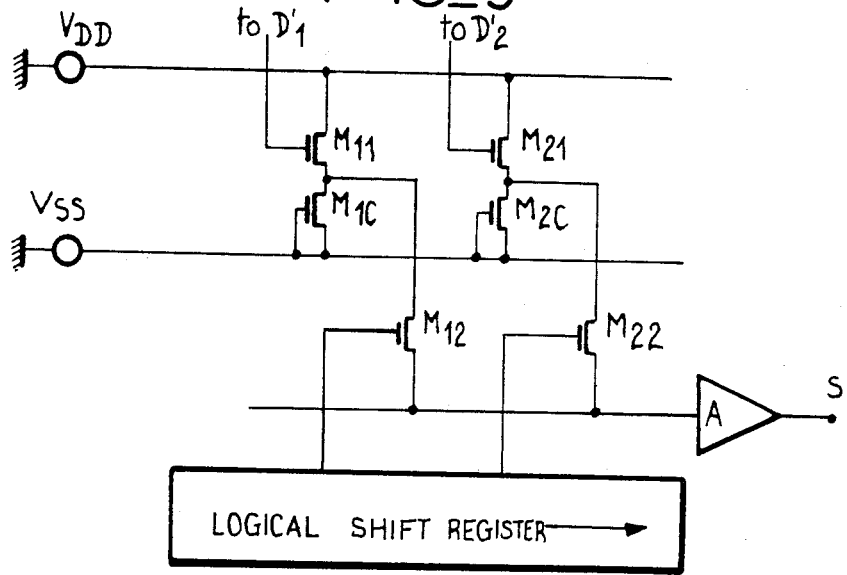
FIG_5

SOLID STATE PHOTOSENSITIVE DEVICE

BACKGROUND OF THE INVENTION

1. Field of the Invention

The present invention concerns solid state photosensitive devices. It concerns more especially the reading stage of these devices.

2. Description of the Prior Art

The solid state photosensitive devices currently used both in the visible and the infra-red ranges are principally constituted by photonic detection and charges integration cells and by a reading device constituted by at least one charge transfer shift register receiving in parallel through the intermediary of a transfer gate the charges integrated in the integration zone of the cells and delivering them in series towards a reading stage giving at its output an image analysis electric signal.

The utilization of a charge transfer or coupled device or CCD in the reading device presents a certain number of drawbacks. Indeed, in order to obtain a correct flow of the charges from one stage to the other of the charge transfer device, it is necessary that the electric potentials increases from the CCD input towards the output. Now the, output voltage of the CCD often being limited by the maximal voltage that can be supported by the output stage, this means that the input voltage of the CCD is low, which consequently limits the quantity of charges able to be injected in the input stage. This progressive increase of the potentials can be avoided by pulsating certain voltages, but this therefore involves a greater complexity of the control electronics.

Furthermore, when the number of photonic detection cells is high, performances are limited by the inefficiency of the transfer and the transfer noise of the charge transfer device, particularly when working with large quantities of charges and at high operating frequencies.

The object of the present invention is to overcome the above-mentioned drawbacks.

SUMMARY OF THE INVENTION

The present invention thus concerns a solid state photosensitive device of the type comprising at least one photonic detection and charges integration cell connected to a reading stage giving at the output an analysis image electric signal, wherein the reading stage is constituted by:

voltage reading means each connected to a detection and integration cell through the intermediary of means allowing to read the potential corresponding to the quantity of charges in the integration zone;

at least one addressing means for sequentially addressing one of the reading means;

and return at zero means of the previously read detection and integration cell.

According to a preferred embodiment, the voltage reading means is constituted by a follower stage, especially by a MOS transistor the source of which is connected to a load and the gate to a diode constituting the means allowing to read the potential corresponding to the quantity of charges in the integration zone.

Thus the reading stage no longer comprises a charges transfer device, and the drawbacks inherent in this type of device are therefore suppressed.

Furthermore, the charges transfer device is replaced by a limited number of MOS transistors necessitating less surface, which allows a considerable reduction of the dimensions of the photosensitive device or the integration of a greater number of cells.

BRIEF DESCRIPTION OF THE DRAWINGS

Other characteristics and advantages of the present invention will appear from reading through the following description of various embodiments given with reference to the annexed drawings in which:

FIG. 1 is a view from above of a strip type photosensitive device, utilized for infra-red applications, according to an embodiment of the present invention;

FIG. 2 is a schematic representation, according to the prior art, of a stage of the device of FIG. 1, and the corresponding surface potentials in the substrate in which is integrated the multiplexer device;

FIG. 3 is a view from above of a matrix photosensitive device comprising a reading stage according to the present invention;

FIG. 4 is a view similar to that of FIG. 2 in the case of a photosensitive device utilized in the visible range;

FIG. 5 is a further view from above of another embodiment of a reading stage according to the present invention.

DESCRIPTION OF PREFERRED EMBODIMENTS

In the different figures, the same references designate the same elements but for clarity's sake the dimensions and the proportions of the various elements have not been respected.

FIG. 1 represents a photosensitive device utilized in the infra-red range. In a manner known per se, this photosensitive device is constituted by photonic detection and charges integration cells 1 and a reading stage 2 giving at output an image analysis electric signal. By way of example, FIG. 1 represents a photosensitive device comprising four cells. Of course, the device according to the invention can comprise a greater number of cells, the said cells being able to be aligned as in FIG. 1 or, for example, disposed in a matrix as explained herein-below with reference to FIG. 3.

In the infra-red range and as represented in FIG. 1, each cell 1 comprises an photosensitive detector 3 integrated on a semiconductor substrate 4 different from the substrate 5 on which are integrated the other elements of the photosensitive device and an integration zone realized on the substrate 5. The substrate 4 is preferably realized in cadmium and mercury telluride, in tin and lead telluride, or in indium antimonide. Furthermore, the substrate 5 is preferably realized in P type silicon, although it could be realized in N type silicon in the case of detection diodes with a common cathode, in gallium arsenide or any other equivalent semiconductor material.

By way of example, and as represented in FIGS. 1 and 2, the photosensitive detector 3 utilized in the present invention is a photodiode. However, it is obvious for the man skilled in the art that the invention is applicable, whatever the detector utilized.

Thus, as represented in FIGS. 1 and 2, anode A of the photodiode 3 receives a polarization voltage $V_{SD}$. Its cathode K is connected by a connection 7 to the charge integration zone that allows to integrate in the substrate 5 the charges created in the photodiode 3 by the radiation to be detected, symbolized by the wavy arrows represented in FIG. 2.

Moreover, each charges integration zone realized on the semiconductor substrate 5 that is polarized at a voltage $V_{SM}$ comprises a diode D constituted by a N type zone realized in the P type silicon semiconductor substrate 5. This zone is designated by the reference $N_1^+$ in FIG. 2. Each diode is connected by one of the connections 7 to the cathode K of the corresponding photodiode. Further, a gate $G_C$ connected to a polarization voltage $V_{GC}$ separates each diode D of a charges storage capacity constituted by one part of a gate $G_{ST}$, an insulating layer and the substrate. For reasons of clarity, FIG. 2 does not represent the insulating layer that separates the various gates of the surface of the semiconductor substrate 5.

Furthermore, as represented in FIGS. 1 and 2, according to the present invention, the reading stage 2 comprises four voltage reading means constituted by follower-wise mounted MOS transistors $M_{i1}$. The gate $G_1$ of each MOS transistor $M_{i1}$ is connected to a diode D' adjacent to the storage capacity of each detection and charges integration cell 1. This diode D' is realized by a N type diffusion, designated by the reference $N_2^+$. The purpose of this diode D' will be explained herein-below in further detail with reference to the surface potentials represented in FIG. 2. The drain of the MOS transistors $M_{i1}$ realized by the N type diffusion referenced $N_3+$ on the FIG. 2 is connected to a polarization voltage $V_{DD}$. Moreover, the source of the MOS transistors $M_{i1}$ is connected through the intermediary of MOS transistors $M_{i2}$ acting as switch to a charge $M_C$. In the embodiment represented, a single load is utilized for all the follower stages that allows to limit the power. However, within the scope of the invention, one load per follower stage could also be utilized, as represented by $M_{1C}$, $M_{2C}$ in FIG. 5. In this case, the source of each MOS transistor $M_{i1}$ is connected to the load $M_{iC}$ and to a MOS transistor $M_{i2}$. This load $M_C$ is constituted by a depletion MOS transistor of which the gate $G_3$ is connected to the source realized by N type diffusion referenced a $N_6^+$ in FIG. 2, this source being polarized by a direct current $V_{SS}$. However, the charge could be realized by other types of current source or by a resistance.

On the other hand, each gate $G_2$ of the switch MOS transistors $M_{i2}$ is connected to one of the outputs of a logic shift register R with serie input and parallel outputs. As will be explained in further detail herein-below, the shift register R allows to address and to bring to the on-state one of the MOS transistors $M_{i2}$, and consequently to carry out the multiplexing of the different follower stages.

The reading stage 2 comprises, moreover, return to zero means. These return to zero means are realized by MOS transistors $M_{i3}$ of which the gate $G_4$ is connected to the output of the logic shift register R corresponding to the preceding follower stage. The induced source of the MOS transistors $M_{i3}$ is constituted by the storage capacity of the corresponding integration zone and the drain realized by a N type diffusion referenced $N_7+$ is connected to a direct voltage $V_{RAZ}$. In the embodiment represented, a single logic shift register R is utilized to control the switch-MOS transistors $M_{i2}$ and the return to zero MOS transistors $M_{i3}$ which necessitates one stage more than the number of cells or the utilization of a looped shift register. However, the utilization of two independent shift registers can also be envisaged.

The operating of the device described herein-above will now be explained with particular reference to the lower part of FIG. 2. This part represents the surface potential in the substrate 5 during the reading of one stage.

The left-hand part represents the potential under the integration zone of a cell 1 that is realized in a manner known per se by the diode D, the gate $G_C$ and the storage capacity $G_{ST}$ constituting a MOS transistor of which the diode D is the source and Of which the capacity is the drain induced.

This MOS transistor is polarized in saturation state since the voltage $V_{GST}$ applied to the gate $G_{ST}$ is higher than the direct voltage $V_{GC}$ applied to the gate $G_C$. The level of the charges on the diode D is aligned on the potential close to the constant potential existing under the gate $G_C$. The cathode K of the photodiode is polarized by the direct voltage $V_{SD}$ chosen so as to be, for example, equal to 0 volt.

The charges created in the detector by radiation are stored in the capacity under the storage gate polarized by $V_{GST}$, as represented symbolically in FIG. 2, where the hatched zones indicate the presence of minority carriers with respect to the substrate 5.

The reading of the integrated charges in one of the integration zones is realized when the corresponding output i of the shift register R is at the logic level 1 so that the gate of the corresponding MOS transistor $M_{i2}$ receives a high voltage bringing to the on-state the said transistor, all the gates of the other MOS transistors acting as switches receiving a logic level 0 blocking the said transistors. In this case, the MOS transistor $M_{i2}$ behaves like a resistance, the MOS transistor $M_C$, namely the load, becomes connected to the follower transistor $M_{i2}$ and a classic follower stage is thus obtained, the polarization voltage $V_{DD}$ being selected much higher than the polarization voltage $V_{SS}$ as represented in FIG. 2.

The diffusion $N_2^+$ realized to the right of the storage gate $G_{ST}$ and connected to the gate $G_1$ of the MOS transistor $M_{i1}$ allows to obtain at the level of this gate a potential representative of the potential under the storage gate.

Indeed, as represented in FIG. 2, the potential at the level of the diffusion $N_2^+$ is always equal to the potential under the gate $G_{ST}$ whatever this potential. Since the $N_2^+$ diffusion, namely the diode D' is connected to the gate $G_1$, the potential under this gate is aligned, by taking into account the potential difference due to the insulating, on the potential at the level of the diffusion $N_2^+$.

Furthermore, as in the case of the reading the transistor $M_{i2}$ is equivalent to a resistance, the potential at the level of the diffusion $N_5^+$ is aligned on the potential at the level of the diffusion $N_4^+$. Then, the potential at the level of the diffusion $N_4^+$ is function of the potential under the gate $G_1$, since in a follower stage the potential difference $\Delta\phi$ is a constant. A voltage representative of the voltage under the storage gate is thus obtained at the level of diffusion $N_5^+$. This voltage is sent through an amplifier A to the output terminal S of the photosensitive device.

FIG. 2 represents in a broken line the potential under the gate $G_2$ when a logic level 0 is applied on this gate. It will be seen, in this case, that the current cannot flow from the MOS load transistor $M_C$ towards the follower MOS transistor $M_{i1}$. Consequently, only the selected input contributes to the consumption of the circuit.

With respect to the different polarization voltages they must be chosen so that:

$$V_{SM} \leq V_{SD}$$

$$V_{GC} \cong V_{SD} + V_T$$

where $V_T$ is the threshold voltage of a MOS transistor $$V_{SM} \leq V_{SS} \leq V_{DD}$$

By way of example, the values indicated hereinbelow can be taken for different voltages, by supposing that $V_T=2$ volts on all the MOS transistors, except on the transistors $M_C$, $M_{iC}$ where the threshold voltage is negative.

EXAMPLE 1

$V_{SM} = -3$ V, $V_{SD}=0$, $V_{GC} \cong 2$ V, $V_{SS}=-3$ V
$V_{GST}=15$ V, $V_{RAZ}=12$ V, $V_{DD}=14$ V

EXAMPLE 2

$V_{SM}=-1$ V, $V_{SO}=V_{SS}=0$ V, $V_{GC} \cong 2$ V
$V_{GST}=V_{DD}=V_{RAZ}=15$ V Furthermore, $V_{EL}$ represents the logic impulses sent into the input of the register R and which are shifted under the action of clock H pulses.

After having read the data on the input i, the logic level "1" of the shift register R is shifted by one stage under the action of the clock H. The reading of input i+1 is thus realized.

According to the present invention, the logic level "1" is applied on the gate $G_4$ of the MOS transistor $M_{i3}$ of return to level which is brought to on-state. The charges that are present under the storage gate $G_{ST}$ are thus evacuated towards the voltage source $V_{RAZ}$ that can be chosen equal to the voltage $V_{DD}$. The reinitialization of the value of the storage capacitor of the input i is thus carried out during the reading of the input i+1. In fact, during this return to zero of the storage capacity, the charges delivered by the photodiode are directly evacuated towards the voltage source $V_{RAZ}$ and thus unexploited. However, this is not detrimental, since the number of detection and integration cells is in praxis relatively high and the fraction of the unexploited charges thus remains in reality negligible.

Furthermore, according to a supplementary characteristic of the invention, by suitably adjusting the value of the voltage of the logic level "0" of the shift register, an anti-blooming function is ensured. Indeed, the excess charges can overflow underneath the potential limit created under the gate $G_4$ towards the voltage source $V_{RAZ}$ before the overflowing is possible towards the other input stages.

This anti-blooming function can be realized in two ways.

By utilizing the teaching of U.S. patent application No. 505,751 filed 6-20-83 in the name of Marc ARQUES, an anti- blooming effect is obtained when:

(1) the substrates are polarized with voltages $V_{SM}$ and $V_{SD}$ according to the following equations:

$$V_{SD} < V_{SM}$$

$$|V_{SM} - V_{SD}| \geq |V_{comax}|$$

where $V_{comax}$ is an additional voltage of the circuit open voltage of photodiodes (of about 20 to 50 mV) and, (2) one of the gates of the input stage is controlled by a pulsed voltage.

In the case of the present invention, only the first condition needs to be realized.

It is thus possible to create between different input stages, insulating barriers sufficiently high that in the case of over-lighting, the polarization point of the photodiode can be displaced from its normal position to the open circuit point where the current of the photodiode is cancelled before there is overflowing towards the other inputs. This occurs if the logic level "0" is sufficiently low. If the logic level "0" is not low enough there is overflowing below the potential barrier created under the gate $G_4$ prior to reaching the open circuit point. However, this overflowing occurs towards the polarization voltage $V_{RAZ}$ which is not detrimental. In both cases, there is protection against blooming.

Furthermore, if the teaching of U.S. patent application No. 505,751 is not utilized, the condition for realizing anti-blooming is that:

logic level "0" $\geq V_T$.

Indeed, by supposing $V_{SM} = V_{SD} = 0$, the insulating barriers between the input stages cannot be lower than $V_{SM}=0$. In particular, it is not possible to have insulating barriers $a-|V_{comax}|$. This means that the current of the photodiode can never be cancelled. There will thus be overflowing. However, it is sought to realize this overflowing under gate $G_4$ towards voltage $V_{RAZ}$ so that it is not detrimental. If the other insulations between the input stages are at $V_{SM}=0$, it is necessary that the surface potential under the gate $G_4$ always be lower than 0. It is thus necessary that the voltage applied to the gate $G_4$ always be higher than $V_T$, and thereby the condition recalled herein-below.

The application of the present invention to a matrix type solid state photosensitive device will now be described with reference to FIG. 3. The matrix device represented is constituted by two lines of three detection and integration cells. In order to simplify the drawing, the photodiodes foreseen on an independant substrate have not been represented. Each line presents the same structure as the photosensitive device described with reference to FIG. 1.

To each photodiode are thus associated a diode D, a part of the control gate $G_C$, a part of the storage gate $G_{ST}$, a follower MOS transistor $M_{i1}$, a MOS transistor $M_{i2}$ acting as switch and a MOS transistor $M_{i3}$ of return to zero. However, the logic shift register R controlling the MOS transistors $M_{i2}$ is common to the whole of the lines.

Furthermore, in the embodiment represented, the photosensitive device comprises a single output S, the multiplexing of the different lines being realized in a manner identical to the multiplexing of the different cells in the case of FIG. 1. Namely, a MOS transistor $M_J$ acting as switch is mounted between the source of transistors $M_{i2}$ and a single load $M_C$, these MOS transistors $M_J$ being controlled by a shift register R' of series input/parallel outputs in which a logic level 1is caused to advance under the action of a clock H'.

Clock H' is chosen in such a way that, during an impulse, all the register R is brought to the on-state. Other embodiments can be envisaged.

Thus, it can be envisaged to connect at the end of each line a load $M_c$ and an amplifier A, the outputs of each of the amplifiers being connected to an input of a multiplexer that can be realized, for example, by a charges transfer device or by a network of MOS transistors.

FIG. 4 is a view identical to that of FIG. 2, the only difference being the fact that the solid state photosensitive device being intended to detect a visible radiation, the detectors are integrated on the substrate 5. In the present case, the photonic detection and integration cell is realized in a single element, namely a photo MOS. At the level of the input of the charges, only one storage gate $G_{ST}$ connected to a polarization voltage $V_{GST}$ remains.

With respect to the operation of the devices of FIGS. 3 and 4, it is identical to that described with reference to FIG. 2 and will not be further described.

What is claimed is:

1. A solid state photosensitive device comprising photon detection and charge integration cells connected to a reading stage which gives an output analysis image electric signal, wherein said reading stage comprises:
   (a) voltage reading means each connected to a detection and integration cell through reading means for reading a potential corresponding to the quantity of charges in the integration zone or a cell;
   (b) at least one addressing means for sequentially addressing one of the reading means; and
   (c) means for resetting the previously read detection and integration cell.

2. A photosensitive device according to claim 1, wherein each reading means is constituted by a follower stage.

3. A photosensitive device according to claim 2, wherein the follower stage comprises a MOS transistor mounted between a load and a polarization voltage and the gate of which is connected to reading means for reading the potential corresponding to the quantity of charges in the integration zone.

4. A phototosensitive device according to claim 3, wherein the load is common to the whole of the follower stage.

5. A photosensitive device according to claim 4, wherein the load is connected to the MOS-follower transistors through the addressing means.

6. A photosensitive device according to claim 3, wherein the load is constituted by a load resistance or by a MOS transistor mounted as a current source.

7. A photosensitive device according to claim 1, wherein the reading means for reading the potential corresponding to the quantity of charges in the integration zone of the cell is constituted by a diffusion of a doping type opposite to that of the substrate.

8. A photosensitive device according to claim 1, wherein the addressing means is constituted by a logic shift register with series input and parallel outputs of which each output is connected by the intermediary of a switch to reading means.

9. A photosensitive device according to claim 8, wherein the switch is constituted by a MOS transistor mounted between each output of the follower MOS transistor and the load, the gate of the said MOS transistor being controlled by one of the outputs of the shift register.

10. A photosensitive device according to claim 1, wherein each return to zero means is constituted by a MOS transistor mounted between the integration zone of a cell and a polarization voltage, the gate of the said MOS transistor being controlled by the output of the shift register corresponding to the preceding reading means.

11. A photosensitive device according to claim 10, wherein the MOS transistors of the return to zero means are utilized as an anti-blooming device.

12. A photosensitive device according to claim 1, wherein in the case of a matrix type photosensitive device, it comprises furthermore means for realizing the multiplexing of the different lines of the matrix.

13. A photosensitive device according to claim 12, wherein the means for realizing the multiplexing of the different lines of the matrix is constituted by a charges transfer shift register with parallel inputs and serie outputs, each input being connected to the output of the reading stage of each line.

14. A photosensitive device according to claim 12, wherein the means for realizing the multiplexing of the different lines of the matrix is constituted by switches mounted on each line between the output of the column switches and a single load, the said switches being controlled by a logic shift register of series input and parallel outputs.

15. A photosensitive device according to claim 14, wherein the switches are constituted by MOS transistors.

* * * * *